US012645335B2

(12) United States Patent
Wang et al.

(10) Patent No.: US 12,645,335 B2
(45) Date of Patent: Jun. 2, 2026

(54) FABRIC TOUCH DEVICE

(71) Applicant: WUYI UNIVERSITY, Jiangmen (CN)

(72) Inventors: Fei Wang, Jiangmen (CN); Jiehong Zheng, Jiangmen (CN); Juejing Dai, Jiangmen (CN); Hui Yu, Jiangmen (CN); Xi Wang, Jiangmen (CN)

(73) Assignee: WUYI UNIVERSITY, Jiangmen (CN)

( * ) Notice: Subject to any disclaimer, the term of this patent is extended or adjusted under 35 U.S.C. 154(b) by 0 days.

(21) Appl. No.: 18/802,172

(22) Filed: Aug. 13, 2024

(65) Prior Publication Data

US 2025/0224845 A1 Jul. 10, 2025

(30) Foreign Application Priority Data

Jan. 10, 2024 (CN) .......................... 202410035110.5

(51) Int. Cl.
*G06F 3/045* (2006.01)
*H05K 1/03* (2006.01)
*H05K 3/10* (2006.01)

(52) U.S. Cl.
CPC ............. *G06F 3/045* (2013.01); *H05K 1/038* (2013.01); *H05K 3/10* (2013.01); *G06F 2203/04102* (2013.01)

(58) Field of Classification Search
CPC ........... G06F 3/045; G06F 2203/04102; G06F 2203/04103; H05K 1/038; H05K 3/10; B32B 3/085; B32B 3/266; B32B 5/026; B32B 5/073; B32B 5/08; B32B 5/26; B32B 7/12; B32B 2250/03; B32B 2250/20; B32B 2262/0284; B32B 2262/0292; B32B 2262/062; B32B 2262/14; D03D 1/0088; D03D 15/217; D03D 15/225; D03D 15/283; D03D 15/47; D03D 15/533; D03D 25/005; D04B 1/10; D04B 1/104; D04B 1/12;
(Continued)

(56) References Cited

U.S. PATENT DOCUMENTS 4,659,873 A * 4/1987 Gibson .................. H01H 3/141
178/18.05
5,432,304 A * 7/1995 Tanahashi ............... G06F 3/045
178/18.05
(Continued)

*Primary Examiner* — Patrick N Edouard
*Assistant Examiner* — Joseph P Fox
(74) *Attorney, Agent, or Firm* — Vivacqua Crane, PLLC

(57) ABSTRACT

A fabric touch device includes an upper conductor layer and a lower conductor layer. The upper conductor layer includes a first semiconductor and a first good conductor drawn out from the first semiconductor. The lower conductor layer includes a second semiconductor and a second good conductor drawn out from the second semiconductor. The upper conductor layer and the lower conductor layer remain isolated when an external force is absent. When any one of planar positions of the fabric touch device is subjected to pressure, the upper conductor layer and the lower conductor layer are in contact with each other through intersection between the first good conductor and the second good conductor, such that the first semiconductor and the second semiconductor form a conductive path, and a conduction resistance value obtained by conducting the first semiconductor and the second semiconductor uniquely corresponds to a coordinate of the planar position.

10 Claims, 3 Drawing Sheets

(58) Field of Classification Search
   CPC . D04B 1/16; D04B 1/18; D04B 21/00; D04B
                                21/06; D04B 21/08
   See application file for complete search history.

(56)                    References Cited

U.S. PATENT DOCUMENTS

2007/0056493 A1* 3/2007 Burkitt .................. G06F 3/0221
                                                     112/401
2019/0004635 A1* 1/2019 Sawyer ................ H04R 1/1041
2019/0331540 A1* 10/2019 Wang ..................... C08G 77/04

* cited by examiner

FABRIC TOUCH DEVICE

CROSS-REFERENCE TO RELATED APPLICATION

This application is based on and claims the benefit of priority from Chinese Patent Application No. 202410035110.5, filed on 10 Jan. 2024, the entirety of which is incorporated by reference herein.

TECHNICAL FIELD

Embodiments of the disclosure relate to, but are not limited to, the technical field of smart textiles, and in particular, to a fabric touch device.

BACKGROUND

With the development of science and technology, intelligentization is entering people's daily lives. This has given rise to many hybrid products that combine textile products with electronic devices. The fabric touch technology is particularly important. In the future smart textile industry, fabric touch technology will play an important role equivalent to the keyboard and mouse in contemporary electronic computers. Therefore, fabric touch technology is one of the important technologies in the smart textile industry.

The current fabric touch device generally includes an upper conductor layer, a middle conductor layer, and a lower conductor layer. When subjected to pressure, the upper conductor layer and the lower conductor layer are conducted through the middle conductor layer at a pressure position, such that a resistance signal of the middle conductor layer is measured through the upper conductor layer and the lower conductor layer. However, this technology requires that the resistances of the middle conductor layer at various positions in a plane are different, so as to identify the pressure position. The middle conductor layer yet requires the preparation of special yarn or a plurality of repeated printings to realize that the resistances of the middle conductor layer at various positions in the plane are different, which makes the processing difficult. Therefore, how to develop a fabric touch device with a simple structure and easy processing has become an urgent technical problem to be solved.

SUMMARY

The following is a summary of the subject matter detailed herein. This summary is not intended to limit the scope of the claims.

An embodiment of the disclosure provides a fabric touch device that does not require the fabrication of a middle conductor layer as compared to the existing technology, which has the advantages of simple structure and easy processing.

In a first aspect, an embodiment of the disclosure provides a fabric touch device, including: an upper conductor layer and a lower conductor layer, where the upper conductor layer includes a first semiconductor and a first good conductor drawn out from the first semiconductor, and the lower conductor layer includes a second semiconductor and a second good conductor drawn out from the second semiconductor, and the upper conductor layer and the lower conductor layer remain isolated when an external force is absent; when any one of planar positions of the fabric touch device is subjected to pressure, the upper conductor layer and the lower conductor layer are in contact with each other through intersection between the first good conductor and the second good conductor, such that the first semiconductor and the second semiconductor form a conductive path, and a conduction resistance value obtained by conducting the first semiconductor and the second semiconductor uniquely corresponds to a coordinate of the planar position.

In some embodiments, the first good conductor comprises a plurality of first good conductors separated from each other; and/or the second good conductor comprises a plurality of second good conductors separated from each other.

In some embodiments, at least one of the upper conductor layer and the lower conductor layer has a non-conductive protrusion structure to support the upper conductor layer and the lower conductor layer to remain isolated when an external force is absent.

In some embodiments, an elastic isolation layer is provided between the upper conductor layer and the lower conductor layer, and the elastic isolation layer is provided with a through hole such that the upper conductor layer and the lower conductor layer contact each other via the through hole to form a conductive path when subjected to an external force.

In some embodiments, the elastic isolation layer is a film or a fabric, the elastic isolation layer is made of any one of silicone, polyurethane and elastic polymer material, and the elastic isolation layer is formed in a hole shape or a mesh shape.

In some embodiments, the first good conductor comprises a plurality of first good conductors sequentially drawn out from different positions of the first semiconductor, such that resistance values drawn out by each of the first good conductors are different; and/or the second good conductor comprises a plurality of second good conductors sequentially drawn out from different positions of the second semiconductor, such that resistance values drawn out by each of the second good conductors are different.

In some embodiments, the first semiconductor, the second semiconductor, the first good conductor, and the second good conductor are made of any one of conductive film material, conductive composite material, conductive fiber material, and conductive fiber assembly material.

In some embodiments, the first semiconductor, the second semiconductor, the first good conductor and the second good conductor form a conductive portion with a specific pattern on a surface or a middle portion of a substrate by any of screen printing, stencil printing, spraying, thermal bonding, weaving, knitting, sewing, and embroidery; or, the first semiconductor, the second semiconductor, the first good conductor and the second good conductor are double-layer or multi-layer flexible conductive films obtained by using any of deposition, chemical plating, and electrochemical plating.

In some embodiments, the upper conductor layer and the lower conductor layer are fabrics with metal coatings or conductive composite coatings or intrinsic conductive polymer coatings, or fabrics woven or knitted from conductive fibers, or fabrics blended from conductive fibers and non-conductive fibers.

In some embodiments, a spatial resolution of the fabric touch device is adjusted by changing a pattern distribution density of the first good conductor and a pattern distribution density of the second good conductor; a pressing sensitivity of the fabric touch device is adjusted by a quantity of the first good conductor, a quantity of the second good conductor, and an intersection point of the first good conductor and the second good conductor.

An embodiment of the disclosure provides a fabric touch device, including: an upper conductor layer and a lower conductor layer, where the upper conductor layer includes a first semiconductor and a first good conductor drawn out from the first semiconductor, and the lower conductor layer includes a second semiconductor and a second good conductor drawn out from the second semiconductor, and the upper conductor layer and the lower conductor layer remain isolated when an external force is absent. When any one of planar positions of the fabric touch device is subjected to pressure, the upper conductor layer and the lower conductor layer are in contact with each other through intersection between the first good conductor and the second good conductor, such that the first semiconductor and the second semiconductor form a conductive path, and a conduction resistance value obtained by conducting the first semiconductor and the second semiconductor uniquely corresponds to a coordinate of the planar position. Based on this, the fabric touch device of the disclosure has a simple structure, does not need to use a cumbersome process to produce a special middle layer having different resistances at different positions, and only needs to use an upper conductor layer and a lower conductor layer which are easy to be processed. Based on the unique correspondence relationship between the conduction resistance value obtained by conducting the first semiconductor and the second semiconductor and the coordinate of the planar position, the pressed planar position can be accurately identified when any planar position of the fabric touch device is subjected to a pressure, and therefore, compared with the existing technology, the disclosure has the advantages of simple structure and easy processing.

Additional features and advantages of the disclosure will be set forth in the description which follows, and in part will be apparent from the description, or may be learned by practice of the disclosure. The objectives and other advantages of the disclosure will be realized and obtained by the structure particularly pointed out in the written description and claims hereof as well as the appended drawings.

BRIEF DESCRIPTION OF THE DRAWINGS

The accompanying drawings are used to provide a further understanding of the technical solution of the disclosure and constitute a part of the specification, and together with the embodiments of the disclosure, are used to explain the technical solution of the disclosure and do not constitute a limitation of the technical solution of the disclosure.

DETAILED DESCRIPTION

Figure 1:
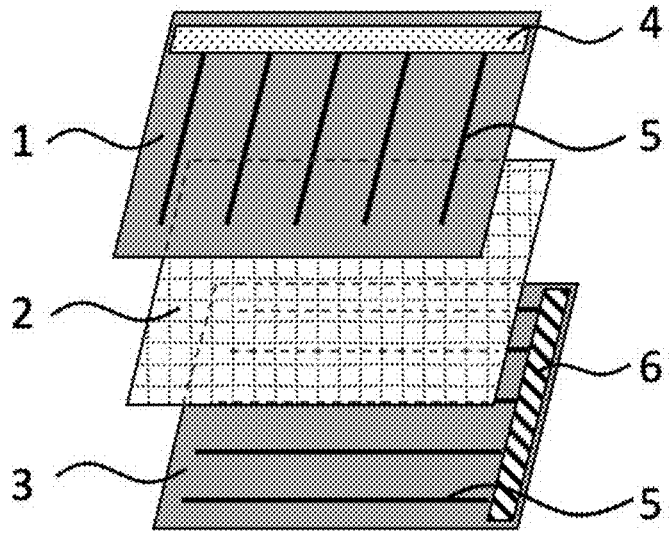
FIG. 1 is a schematic structural view showing a three-layer stereoscopic exploded structure of a fabric touch device according to an embodiment of the disclosure.

In order to make the objectives, technical solutions and advantages of the disclosure clearer and more understandable, the disclosure will be further described in detail below in conjunction with the accompanying drawings and embodiments. It should be understood that the specific embodiments described here are merely used to explain the disclosure and are not intended to limit the disclosure.

It should be understood that in the description of the embodiments of the disclosure, the meaning of "a plurality of (or multiple)" refers to two or more. The terms such as "greater than", "less than", "over" are understood not to include the specified number, while the terms such as "above", "below", "within" are understood to include the specified number. If described, the terms such as "first", "second" are merely for the purpose of distinguishing technical features, and not to be construed as indicating or implying relative importance or implicitly indicating the number of technical features indicated or implicitly indicating the precedence relationship of technical features indicated.

In order to solve the technical problems of complicated structure and difficult processing in the existing technology, an embodiment of the disclosure provides a fabric touch device, including: an upper conductor layer and a lower conductor layer, where the upper conductor layer includes a first semiconductor and a first good conductor drawn out from the first semiconductor, and the lower conductor layer includes a second semiconductor and a second good conductor drawn out from the second semiconductor, and the upper conductor layer and the lower conductor layer remain isolated when an external force is absent; when any one of planar positions of the fabric touch device is subjected to pressure, the upper conductor layer and the lower conductor layer are in contact with each other through intersection between the first good conductor and the second good conductor, such that the first semiconductor and the second semiconductor form a conductive path, and a conduction resistance value obtained by conducting the first semiconductor and the second semiconductor uniquely corresponds to a coordinate of the planar position. Based on this, the fabric touch device of the disclosure has a simple structure, does not need to use a cumbersome process to produce a special middle layer having different resistances at different positions, and only needs to use an upper conductor layer and a lower conductor layer which are easy to be processed. Based on the unique correspondence relationship between the conduction resistance value obtained by conducting the first semiconductor and the second semiconductor and the coordinate of the planar position, the pressed planar position can be accurately identified when any planar position of the fabric touch device is subjected to a pressure, and therefore, compared with the existing technology, the disclosure has the advantages of simple structure and easy processing.

The main body structures of the disclosure are all made of textile materials and can be divided into an upper conductor portion and a lower conductor portion according to the functions, hereafter referred to as the upper conductor layer, and the lower conductor layer. The conductive material of the upper conductor layer includes a first semiconductor and a good conductor. There are one or more good conductors that are drawn out from different positions of the first semiconductor. The plurality of good conductors do not contact each other. Similarly, the lower conductor layer also includes a second semiconductor and a good conductor. There are one or more good conductors that are drawn out from different positions of the second semiconductor. The plurality of good conductors do not contact each other. The resistivities of the first semiconductor and the second semiconductor may be different or the same. It should be ensured that the resistance between the upper conductor layer and the lower conductor layer is infinite when the external force is absent, an isolation layer may be selectively intervened between the two layers. The isolation layer is provided with through holes, such that when subjected to pressure, traces of the good conductors of the upper conductor layer and the lower conductor layer contact each other via the through holes, and a conductive path can be formed between the semiconductors of the upper conductor layer and the lower conductor layer. Since the resistivities of the first semiconductor and the second semiconductor may be different, the upper and lower good conductors drawn from different positions conduct the first semiconductor and the second semiconductor from the upper and lower layers, and the resistance value of the conduction corresponds to the planar position coordinate. However, when the resistivities of the first semiconductor and the second semiconductor are the same, the positions derived from the good conductors in the upper conductor layer and the lower conductor layer can be intentionally set, such that the conduction resistance value at any point in the plane is a unique value, thereby producing a one-to-one correspondence between the resistance value and the planar position coordinate. Moreover, the upper conductor layer and the lower conductor layer may themselves have a stereoscopic structure including non-conductive protrusions, thereby supporting the upper conductor layer and the lower conductor layer to be kept separated, thereby an isolation layer is not required.

It should be noted that the application products of the disclosure are smart textiles, including but not limited to smart clothing, smart home furnishings, smart home textiles, smart car accessories, smart textile toys, etc. As an input terminal of the above products, the disclosure can provide single-point pressing position information for intelligent devices.

In an embodiment, the upper conductor layer, the lower conductor layer and the possible additional elastic isolation layers are all made of textile materials, and therefore, possess the advantages of softness, flexibility, washability, and dryability that are characteristic of wearable textiles.

In an embodiment, the patterns of the semiconductors and good conductors in the conductor layers may be of any shape, as long as the traces of the good conductors in the upper conductor layer are not in contact with each other, and the traces of the good conductors in the lower conductor layer are not in contact with each other. The patterns may be customized according to user needs, such as straight lines, wavy shapes, curves, triangles, rectangles, squares or artistic patterns, etc.

In an embodiment, good conductors in the upper conductor layer are sequentially drawn out from the first semiconductor pattern and good conductors in the lower conductor layer exit sequentially from the second semiconductor pattern. In both the upper conductor layer and the lower conductor layer, all resistance values corresponding to the respective good conductors are unique, and it should be ensured that any two of these values, when added, remain a unique value. When the upper conductor layer and the lower conductor layer are brought into conduction by contact with each other, the first semiconductor and the second semiconductor are connected in series with each other, resulting in a series resistance. Since the resistance value derived from each good conductor is a unique value, it is possible to obtain which good conductor drawn from the first semiconductor and which good conductor drawn from the second semiconductor are in contact with each other, thereby determining the planar position coordinate. For example, the resistivities of the first semiconductor and the second semiconductor differ by more than one hundred times, with the first having resistances that are multiples of 100 kΩ and the second having resistances that are multiples of 1 kΩ. In this way, when the total series resistance has four significant figures, such as 1205 kΩ, the first two digits of the series resistance represent the position of the good conductor of the first semiconductor as the 12th conductor, which corresponds to the horizontal coordinate, and the last two digits represent the position of the good conductor of the second semiconductor as the 5th conductor, which corresponds to the vertical coordinate. This method allows for a high-efficiency and straightforward way to establish a one-to-one correspondence relationship between resistance and position.

In an embodiment, the first semiconductor in the upper conductor layer, the second semiconductor in the lower conductor layer, and the respective good conductors in the upper and lower conductor layers may be made of conductive film materials, conductive composite materials, conductive fiber materials, or conductive fiber assembly materials, preferably flexible conductive polymer materials or conductive composite materials, such as graphene-doped polyimide films, carbon nanotube-doped polyethylene terephthalate films, and carbon fibers. The semiconductors and good conductors in the conductor layers may form a conductive portion with a specific pattern on a surface or middle portion of a substrate by the methods such as screen printing, stencil printing, spraying or thermal bonding, weaving, knitting, sewing or embroidery, including not only the good conductors, but also the first semiconductor and the second semiconductor. A double-layer or multi-layer flexible conductive film may also be obtained by means of deposition, chemical plating, electrochemical plating, etc. Certainly, the upper conductor layer and the lower conductor layer may also be fabrics with metal coatings or conductive composite material coatings or intrinsic conductive polymer coatings, fabrics woven or knitted from conductive fibers, or fabrics blended from conductive fibers and non-conductive fibers.

In an embodiment, the isolation between the upper conductor layer and the lower conductor layer can be achieved by additional elastic isolation layers with through holes, or by a non-conductive protrusion structure provided by the upper conductor layer or the lower conductor layer itself.

In an embodiment, in a three-layer structure considering possible additional isolation layers, the upper conductor layer also needs to have the following characteristics. The first characteristic is that since the semiconductor and the good conductors are woven or knitted to the conductor layer, different good conductors should not be in contact with each other to avoid errors. The second characteristic is that the resistance characteristics of the semiconductor itself should be to ensure constant resistance, such that the resistances at different distances will show linear characteristics. The third characteristic is that the good conductors and the good conductors should have a correspondence relationship under the action of external force, so as to prevent misalignment that would cause the upper and lower layers from being unable to connect and form a circuit.

In an embodiment, the spatial resolution of a touch device may be achieved by changing the pattern distribution density of the good conductors in the upper conductor layer and the pattern distribution density of the good conductors in the lower conductor layer, which may vary with the size of the through holes in the elastic isolation layers, or with the density of the non-conductive protrusions in the upper conductor layer and the lower conductor layer.

In an embodiment, the press sensitivity of the fabric touch device can be adjusted by the number of first good conductors, the number of second good conductors, and the intersection positioning points of the first good conductors and the second good conductors. Furthermore, when the fabric touch device does not have the elastic isolation layers but has a non-conductive protrusion structure, the pressing sensitivity of the touch device can be adjusted by means of the number and intersection positioning points of good conductors in the upper conductor layer and the lower conductor layer, in combination with the size and density of the non-conductive protrusions. When the fabric touch device has the elastic isolation layers, the pressing sensitivity of the touch device can be adjusted by means of the number and intersection positioning points of good conductors in the upper conductor layer and the lower conductor layer, in combination with the thickness and elastic modulus of the elastic isolation layers, as well as the size and shape of the through holes.

In an embodiment, the additional elastic isolation layers may be films or fabrics (woven fabrics, knitted fabrics, braided fabrics or non-woven fabrics), may be made of silicone, polyurethane, or other elastic polymer materials, and thus have the characteristics of being elastic, and also bent and stretched at will. For example, the additional elastic isolation layers may be elastic mesh fabrics, elastic net fabrics, or loose-structured elastic fabrics made of elastic fibers. In addition, the additional isolation layers are made into a hole shape or a mesh shape to limit the touch position and avoid touching non-functional areas. This function can also be realized by the non-conductive protrusions of the upper conductor layer or the lower conductor layer itself, including protrusions made of woven or knitted fibers, and protrusions dispensed by silicone and polymer materials, etc.

In an embodiment, the upper conductor layer, the lower conductor layer and the optional elastic isolation layers may be bonded with adhesives, hot-melt films, etc., but it should be noted that the adhesives, hot-melt films, etc. cannot cover a semiconductor working area to avoid the formation of an insulating layer between the two layers that affects the functional use. The above portions can also be integrated by sewing, or three-dimensional weaving or knitting technology can be used to directly weave or knit the upper and lower conductor layers into a whole.

In an embodiment, the upper conductor layer, the lower conductor layer and the optional elastic isolation layers are not limited to planar structures, but can also be curved structures, which can better fit curved objects such as human bodies, and can even be processed into a three-dimensional structure to cover three-dimensional objects, thereby forming three-dimensional single-point perception.

Embodiments of the disclosure will now be described with reference to the accompanying drawings.

Embodiment 1

Referring to FIG. 1, this embodiment provides a two-wire single-point pressure fabric touch device that can identify horizontal and vertical coordinates in a Cartesian plane coordinate system. The main body of the device is made of textile materials, and the device is composed of an upper conductor layer 1, an elastic isolation layer 2 and a lower conductor layer 3. The upper conductor layer 1 is provided with a first semiconductor 4 and good conductors 5 drawn out from the first semiconductor 4. The lower conductor layer 3 is provided with a second semiconductor 6 and good conductors 5 drawn out from the second semiconductor 6. Between the upper conductor layer 1 and the lower conductor layer 3, there is an isolation layer 2 on which through holes are provided. The upper conductor layer 1 and the lower conductor layer 3 are provided with semiconductors 4, 6 and good conductors 5 on only one side, i.e., on the back side of the upper conductor layer and on the surface of the lower conductor layer.

The good conductors 5 may be made of metal-plated conductive fabrics such as copper-plated conductive fabrics, silver-plated conductive fabrics, and other conductive fabrics containing metal components. Non-conductive fabrics are made of polyester plain woven fabric. The isolation layer 2 is a warp-knitted elastic knitted fabric from polyurethane filaments. The first semiconductor 4 is preferably a polyimide film doped with graphene, the recommended length resistance of the first semiconductor 4 of the upper conductor layer 1 is in the range of 0 to 1,000 ohms per centimeter, and the recommended length resistance of the second semiconductor 6 of the lower conductor layer 3 is in the range of 100,000 to 200,000 ohms per centimeter. The isolation layer 2 is selected from elastic structures printed from thermoplastic elastomers of the styrenic block copolymer type. The adhesive is selected as a hot-melt polyurethane film, but cannot cover the semiconductor and good conductors of the upper and lower conductor layers, otherwise circuit break may occur. Therefore, a sewing method may also be used to sew the three layers of materials together in a non-touch area, such that the occurrence of circuit break can be avoided.

When an external force is absent, the upper conductor layer 1 and the lower conductor layer 3 are isolated by the middle elastic isolation layer 2. When pressed by an external force, the good conductor 5 of the upper conductor layer 1 is in contact with the good conductor 5 of the lower conductor layer 3 to form a circuit. The first semiconductor 4 is divided into five parts on the lower surface of the upper fabric layer, forming, from right to left, resistances of 200 ohms, 400 ohms, 600 ohms, 800 ohms, 1,000 ohms. The second semiconductor 6 is divided into five parts on the right side of the lower fabric layer, forming resistances of 20,000 ohms, 40,000 ohms, 60,000 ohms, 80,000 ohms, and 100, 000 ohms. Thus, when pressed to the intersection point, a multimeter may be used to measure the resistance, e.g., 40,600 ohms, knowing that the intersection point of the third good conductor 5 of the upper conductor layer 1 and the second good conductor 5 of the lower conductor layer 3 is pressed. However, this can only detect the position of the intersection points of the upper and lower good conductors. If only one good conductor is pressed or pressed onto the fabric layer itself, the data will be inaccurate. Therefore, the number of good conductors of the upper and lower fabric layers may be increased, such that more intersection points can be obtained, and thus more position information can be detected.

It should be noted here that the shape of the good conductor 5 may be diversified, and the required conductor pattern may be designed according to the actual situation, and the good conductors in the same layer cannot contact each other.

Embodiment 2

Figure 2:
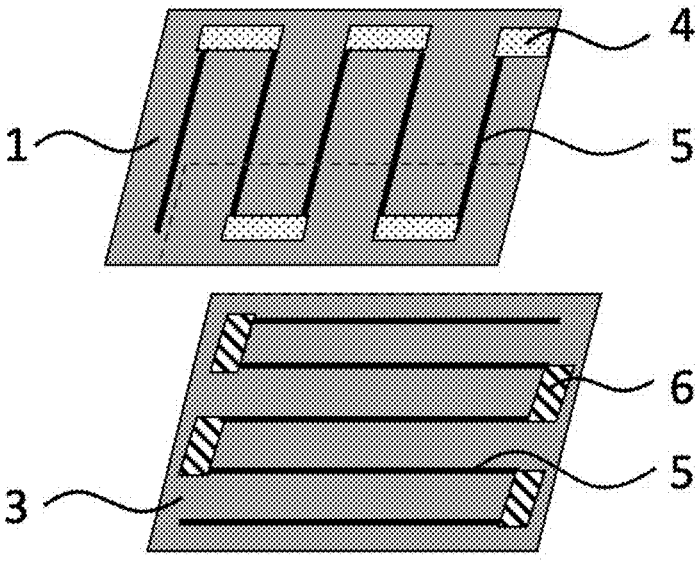
FIG. 2 is a schematic structural view showing a two-layer stereoscopic exploded structure of a fabric touch device according to a second embodiment of the disclosure.

Referring to FIG. 2, this embodiment provides a two-wire fabric touch device for detecting single-point pressing position information. The device adopts a two-layer structure, and the materials selected for the upper conductor layer 1 and the lower conductor layer 3 are the same as those in Embodiment 1. However, there are two differences from Embodiment 1. Firstly, Embodiment 2 does not include an isolation layer, but a fabric protrusion unit is disposed on the lower surface of the upper conductor layer 1 and the upper surface of the lower conductor layer 3, respectively, thereby ensuring that the good conductors 5 of the upper conductor layer 1 and the good conductors 5 of the lower conductor layer 3 are isolated from each other. Secondly, the first semiconductor 4 and the second semiconductor 6 are arranged in a segmented form on both sides, such that the resistance value of the semiconductor which is connected to the circuit can be controlled more accurately and the accuracy of the device can be improved.

Note that this embodiment does not require a significant resistance difference between the first semiconductor 4 and the second semiconductor 6, but only needs to ensure that for the 25 intersection points formed by the upper five good conductors 5 and the lower five good conductors 5, each intersection point has a different resistance value when being conductive. For example, the resistance values corresponding to the 25 intersection points may be: 100 kilo-ohms, 115 kilo-ohms, 133 kilo-ohms, 152 kilo-ohms, 176 kilo-ohms, 196 kilo-ohms, 210 kilo-ohms, 231 kilo-ohms, 257 kilo-ohms, 274 kilo-ohms, 298 kilo-ohms, 323 kilo-ohms, 345 kilo-ohms, 367 kilo-ohms, 379 kilo-ohms, 399 kilo-ohms, 424 kilo-ohms, 458 kilo-ohms, 482 kilo-ohms, 505 kilo-ohms, 534 kilo-ohms, 565 kilo-ohms, 587 kilo-ohms, 609 kilo-ohms, and 635 kilo-ohms.

Moreover, the upper conductor layer 1 and the lower conductor layer 3 may also be fabricated by using a jacquard loom to jointly weave or knit a silver-plated conductive yarn and a cotton-polyester blended yarn. During the weaving or knitting process, it should be ensured that a protruding structure similar to a rib structure is formed at the position that is not where the good conductors and the semiconductors are located. The silver-plated conductive yarn here constitutes traces for the good conductors 5. Then, the polyurethane graphene composite is printed at the position of the semiconductor 4, the multi-arm carbon nanotube polyurethane composite is printed at the position of the semiconductor 6. Finally, the two layers of materials are sewn with a sewing machine in the non-touch area, or the two layers of materials are bonded with an adhesive, and a thermoplastic elastomer of a styrenic block copolymer type can be selected.

Embodiment 3

Figure 3:
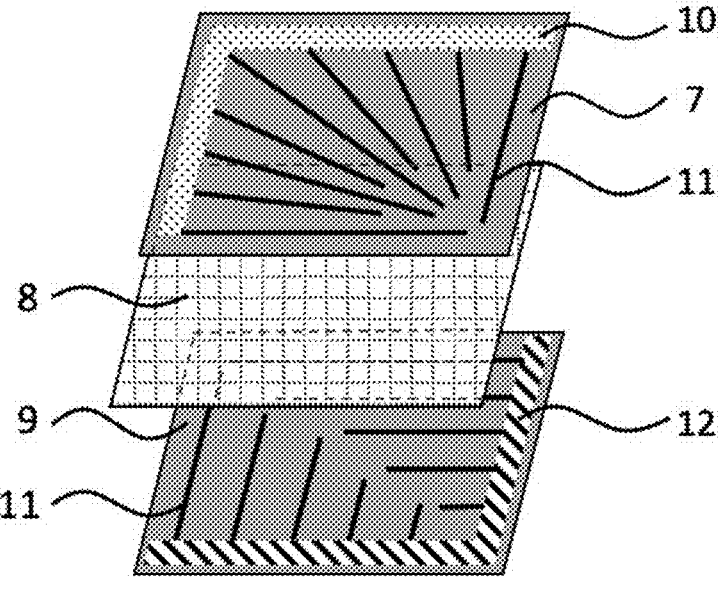
FIG. 3 is a schematic structural view showing a three-layer stereoscopic exploded structure of a fabric touch device according to a third embodiment of the disclosure.

Referring to FIG. 3, this embodiment provides a diagonal two-wire position single-point pressure touch device. With a three-layer structure, the upper conductor layer 7 is arranged with a first semiconductor 10 of a L shape, and good conductors 11 are drawn from different positions of the first semiconductor 10, and all point towards the lower right corner of the device. The lower conductor layer 9 is provided with a second semiconductor 12 with a L shape, and vertically aligned and laterally aligned good conductors 11 are drawn from different positions of the second semiconductor 12. Through holes corresponding to the intersection positions of the good conductors are arranged in the isolation layer 8. The main processing methods of this embodiment involve embroidering process and sewing process. Embroidering is performed at the position of the first semiconductor 10 of the upper conductor layer 7 using a nylon yarn containing graphite and graphene, and embroidering is performed at the position of the second semiconductor 12 with a polyester filament containing copper powder and nickel powder. Patterns of the good conductors 11 are formed by performing embroidering on the upper conductor layer 7 and the lower conductor layer 9 at corresponding positions using copper-nickel-plated nylon yarns. The elastic isolation layer 8 is selected from large-pitch warp-knitted elastic knitted fabrics from polyurethane filaments. The three layers of materials are joined together by sewing. The working principle is the same as that in Embodiment 1 and Embodiment 2. Before practical application, it is necessary to calibrate the conducting resistance at each intersection point of the good conductors to record the unique correspondence relationship between resistance and position. In practical application, the pressing position can be determined by resistance reading. Shown in FIG. 3 is a rectangular touch panel, which can recognize lateral position and longitudinal position, i.e., X and Y coordinates, and coordinate recognition accuracy depends on the size and density of the good conductors 11.

Embodiment 4

Figure 4:
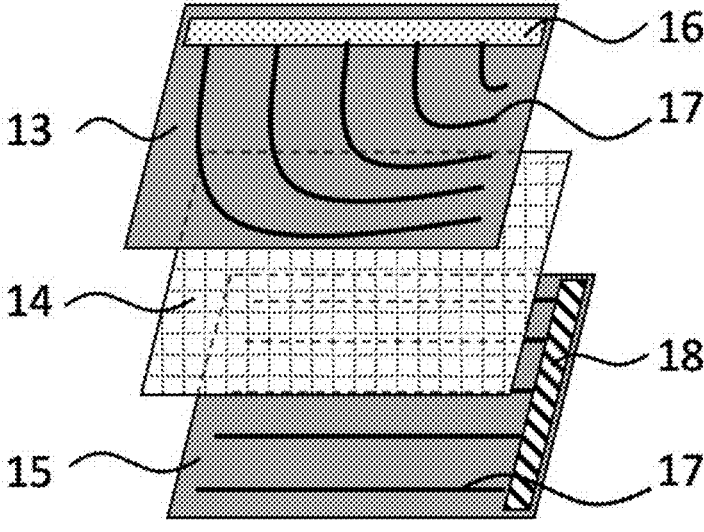
FIG. 4 is a schematic structural view showing a three-layer stereoscopic exploded structure of a fabric touch device according to a fourth embodiment of the disclosure.

Referring to FIG. 4, this embodiment provides a single-point pressure fabric touch device with a curvilinear morphology. The three-layer structure is formed by one-time stereoscopic weaving, which may be three-dimensional weaving, three-dimensional braiding, or three-dimensional knitting. When weaving or knitting the upper conductor layer 13, yarns coated with PSS:PEDOT are used to create the first semiconductor 16, and at the same time, copper-nickel plated nylon yarns are used to form the good conductors 17. The second semiconductor 18 is formed from yarns coated with polypyrrole, and at the same time, copper-nickel-plated nylon yarns are used to form the good conductors 17. The middle elastic isolation layer 14 is formed by weaving or knitting a mixture of Lycra yarn and polyester cotton yarn, and a through hole is left at each intersection point of the good conductors 17. Meanwhile, the elastic isolation layer 14 also tightly connects the upper conductor layer 13 and the lower conductor layer 15 together to form a stereoscopic structure which is stable and reliable in relative position, thereby enhancing the shearing resistance of the device itself and minimizing the dislocation between the upper conductor layer 13 and the lower conductor layer 15. Since the touch panel of this embodiment is formed by one-time weaving, its spatial structure has incomparable stability, is not subjected to transverse dislocation, has excellent durability and bending resistance, and also has the washing and drying resistance of conventional textile fabrics. Meanwhile, the processing is more efficient, offering greater advantages for large-scale production line operations.

When an external force is absent, the upper conductor layer 13 and the lower conductor layer 15 are isolated by the middle elastic isolation layer 14. When pressed by an external force, the good conductor 17 of the upper conductor layer 13 is in contact with the good conductor 17 of the lower conductor layer 15 to form a circuit. The good conductor 17 of the upper conductor layer 13 is curved to increase the number of the intersection points with the conductor layer 15 to realize the detection of more points, and the detection principle is the same as that in Embodiment 1.

Embodiment 5

Figure 5:
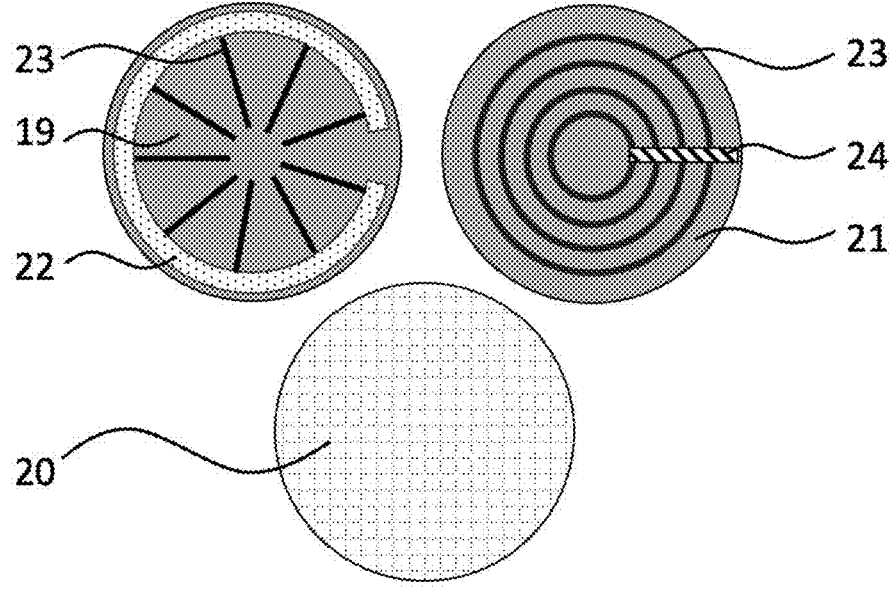
FIG. 5 is a schematic structural view showing a three-layer plane exploded structure of a fabric touch device according to a fifth embodiment of the disclosure.

Referring to FIG. 5, this embodiment provides a circular single-point pressure touch device. A three-layer structure is adopted, including an upper conductor layer 19, an isolation layer 20 and a lower conductor layer 21. A first semiconductor 22 made of a graphite silicone composite and good conductors 23 made of a multi-walled carbon nanotube silicone composite are screen printed on the surface of the warp-knitted plain nylon fabric of the upper conductor layer 19. The first semiconductor 22 is arranged around the circumference of the circular fabric, and the good conductors 23 are arranged radially from the center of the circle outward and are electrically connected to the first semiconductor 22. A second semiconductor 24 made of a graphitic carbon black silicone composite and good conductors 23 made of a multi-walled carbon nanotube silicone composite are screen printed on the surface of the warp-knitted plain nylon fabric of the lower conductor layer 21. The second semiconductor 24 is arranged on the right side of the circle, corresponding to the opening position of the first semiconductor 22 in the upper conductor layer 19, and the good conductors 23 are arranged in concentric circles and are respectively electrically connected to the second semiconductor 24. The isolation layer 20 is made of mesh fabric composed of weft-knitted nylon spandex elastic knitted fabric. The three layers are bonded together with adhesives which are applied only to areas free of conductive materials, thus avoiding the occurrence of a circuit break. The basic idea of this embodiment is different from the afore-mentioned embodiments. The preceding four embodiments above use Cartesian plane coordinate system, and the polar coordinate system is used here, i.e., the angle information is identified by the upper conductor layer 19 and the radius information is identified by the lower conductor layer 21. Combining these two pieces of information, any position within the circular plane can be identified.

It should be noted that this embodiment is not limited to a plane layout, and may also be made of three layers of elastic fabrics. In this case, the entire device can perfectly fit on a hemispherical surface, thereby achieving position identification on the surface of a hemispherical three-dimensional structure.

By utilizing a variety of conductive composite materials, conductive textile materials, and ordinary fiber yarn fabrics as raw materials and leveraging the design of textile and fiber composite structures, the disclosure produces a position touch device with the light, thin and soft properties of textiles, easy processing, low cost and high position recognition accuracy by using textiles as main base materials and using conventional weaving, knitting, printing, ironing, sewing and embroidery processes in the textile and garment industry.

It should be noted that all materials of the fabric touch device of the disclosure are made of textile materials, and have the unique properties of textiles such as being light, soft, comfortable, durable, machine washable and dryable, and can be well combined with traditional textile and clothing products, different from traditional hard photoelectric or silicon-based electronic components.

It should be noted that the fabric touch device of the disclosure has a simple structure with only two wires, simplified wiring, an extremely simple circuit, and easy data reading. Compared with matrix scanning of other flexible pressure sensor matrix, the disclosure has unparalleled advantages, minimizing the number of wires and backend circuit complexity, while enhancing device stability.

It should be noted that the fabric touch device of the disclosure has endless variations, such as position and angle measurement devices, electronic device controllers with planes or curved surfaces or even three-dimensional spaces, such as flexible keyboards, textile keyboards, textile pressure touch panels, etc., and can be flexibly used in various smart homes, smart clothing, IoT devices, and even medical and military products.

It should be noted that compared with other two-wire position fabric touch panels, the disclosure is very simple to process and needs no cumbersome processes to realize the special middle layer with different resistances at different positions. The simplest process only requires embroidery and sewing. In addition, compared with other two-wire position fabric touch panels, the position accuracy of good conductors and the spatial density of good conductor arrangement in the disclosure are much higher than that of fabric touch panels with intermediate layers of different resistances, thereby achieving higher position resolution and detection accuracy.

Based on this, compared with the existing technology, the fabric touch device of the disclosure at least has the following beneficial effects:

1. The fabric touch device is thin, soft and comfortable, and can be used to realize single-point position measurement of the entire touch curved surface or plane position.
2. The fabric touch device is simple in structure, easy to manufacture, low in cost, and easy to produce.
3. The spatial resolution of position recognition is high, and the recognition accuracy is high.
4. The fabric touch device is strong in bending and shear resistance, resistance to bending fatigue, shear fatigue, compression fatigue, and is machine washable and dryable.
5. The fabric touch device has simple wiring with only two wires, avoiding complex wiring to the greatest extent; and resistance signals are easily read, avoiding complex signal reading means such as matrix scanning, and reducing the occupation of peripheral circuits and computing resources.
6. The fabric touch device can be used for various textile-related wearable smart textiles such as smart pillows, smart shoes and insoles, smart school bags, smart cushions, smart mattresses, smart clothing, etc., providing functions such as plane single-point position measurement, plane angle measurement, curved surface single-point position measurement, and single-point position measurement on the surface of a three-dimensional object.

The above is a detailed description of the preferred implementations of the disclosure, but the disclosure is not limited to the above-mentioned embodiments. Those of ordinary skills in the art can also make various equivalent modifications or substitutions without deviating from the sharing conditions of the gist of the disclosure. These equivalent modifications or substitutions are all included in the scope defined by the claims of the disclosure.

What is claimed is:

1. A fabric touch device, comprising an upper conductor layer and a lower conductor layer, wherein the upper conductor layer comprises a first semiconductor and a plurality of first good conductors sequentially each drawn out from a respective position of the first semiconductor, the plurality of first good conductors separated from each other such that resistance values drawn out from the first semiconductor by each of the first good conductors are different; the lower conductor layer comprises a second semiconductor and a plurality of second good conductors sequentially each drawn out from a respective position of the second semiconductor, the plurality of first good conductors separated from each other such that resistance values drawn out from the second semiconductor by each of the second good conductors are different; and wherein anyone of the plurality of first good conductors of the upper conductor layer and anyone of the plurality of second good conductors of the lower conductor layer remain isolated when an external force is absent, a series resistance value obtained by conducting anyone of the plurality of first good conductors and anyone of the plurality of second good conductors is unique;

when any upper surface position of the upper conductor layer of the fabric touch device is touched and subjected to a pressure sufficient to bring the upper conductor layer and the lower conductor layer in contact with each other at a touched position, wherein the upper conductor layer and the lower conductor layer are in contact with each other through intersection between one of the plurality of first good conductors and one of the plurality of second good conductors, such that the contacted first good conductor semiconductor and the second good conductor form a conductive path, and a series resistance value obtained by conducting the contacted first good conductor and the second good conductor uniquely corresponds to a coordinate of the touched position.

2. The fabric touch device according to claim 1, wherein the first semiconductor, the second semiconductor, the plurality of first good conductors, and the plurality of second good conductors are made of any one of conductive film material, conductive composite material, conductive fiber material, or conductive fiber assembly material.

3. The fabric touch device according to claim 1, wherein the first semiconductor, the second semiconductor, the plurality of first good conductors and the plurality of second good conductors form a conductive portion with a specific pattern on a surface or a middle portion of a substrate by any of screen printing, stencil printing, spraying, thermal bonding, weaving, knitting sewing, or embroidery; or, the first semiconductor, the second semiconductor, the plurality of first good conductors and the plurality of second good conductors are double-layer or multi-layer flexible conductive films obtained by using any of deposition, chemical plating, or electrochemical plating.

4. The fabric touch device according to claim 1, wherein the upper conductor layer and the lower conductor layer are fabrics with metal coatings or conductive composite coatings or intrinsic conductive polymer coatings, or fabrics woven or knitted from conductive fibers, or fabrics blended from conductive fibers and non-conductive fibers.

5. The fabric touch device according to claim 1, wherein a spatial resolution of the fabric touch device is adjusted by changing a pattern distribution density of the plurality of first good conductors and a pattern distribution density of the plurality of second good conductors; a pressing sensitivity of the fabric touch device is adjusted by a quantity of the plurality of first good conductors, a quantity of the plurality of second good conductors, and an intersection point of the plurality of first good conductors and the plurality of second good conductors.

6. The fabric touch device according to claim 1, wherein the resistivities of the first semiconductor and the second semiconductor differ by more than one hundred times.

7. The fabric touch device according to claim 1, wherein the resistance of the first semiconductor is multiples of 100 kΩ, and the resistance of the second semiconductor is multiples of 1 kΩ.

8. The fabric touch device according to claim 1, wherein the first semiconductor comprises a plurality of segments arranged on both sides of the upper conductor layer, and the second semiconductor comprises a plurality of segments arranged on both sides of the lower conductor layer.

9. The fabric touch device according to claim 1, wherein an elastic isolation layer is provided between the upper conductor layer and the lower conductor layer, and the elastic isolation layer is provided with a through hole such that one of the plurality of first good conductors of the upper conductor layer and one of the plurality of second good conductors of the lower conductor layer contact each other via the through hole to form a conductive path when subjected to an external force.

10. The fabric touch device according to claim 9, wherein the elastic isolation layer is a film or a fabric, the elastic isolation layer is made of any one of silicone, polyurethane and elastic polymer material, and the elastic isolation layer is formed in a hole shape or a mesh shape.

* * * * *